United States Patent
Zhang (10) Patent No.: US 8,102,196 B1
(45) Date of Patent: Jan. 24, 2012

(54) PROGRAMMABLE DUAL PHASE-LOCKED LOOP CLOCK SIGNAL GENERATOR AND CONDITIONER

(75) Inventor: Benyong Zhang, Auburn, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/759,987

(22) Filed: Apr. 14, 2010

Related U.S. Application Data (62) Division of application No. 12/185,452, filed on Aug. 4, 2008, now abandoned.

(60) Provisional application No. 61/076,240, filed on Jun. 27, 2008.

(51) Int. Cl.
 *H03L 7/06* (2006.01)
(52) U.S. Cl. ......................................... 327/156; 327/147
(58) Field of Classification Search .................. 327/156, 327/147
 See application file for complete search history.

(56) References Cited

U.S. PATENT DOCUMENTS

| | | | | |
|---|---|---|---|---|
| 4,706,045 A | * | 11/1987 | Ouyang et al. | 331/117 FE |
| 5,802,463 A | * | 9/1998 | Zuckerman | 455/208 |
| 6,021,319 A | * | 2/2000 | Tigwell | 455/151.2 |
| 6,218,876 B1 | * | 4/2001 | Sung et al. | 327/156 |
| 6,433,599 B2 | * | 8/2002 | Friedrich et al. | 327/165 |
| 6,842,056 B1 | * | 1/2005 | Wong et al. | 327/147 |
| 6,970,030 B1 | | 11/2005 | Huang et al. | |
| 7,151,399 B2 | * | 12/2006 | Kaizuka | 327/295 |
| 7,173,464 B2 | * | 2/2007 | Nagasue | 327/175 |
| 7,499,689 B2 | * | 3/2009 | Uozumi et al. | 455/260 |
| 7,521,974 B2 | * | 4/2009 | Kirschenmann | 327/156 |
| 7,541,880 B2 | * | 6/2009 | Galloway et al. | 331/16 |
| 7,551,906 B2 | * | 6/2009 | Ikeda et al. | 455/165.1 |
| 7,573,303 B1 | * | 8/2009 | Chi et al. | 327/105 |
| 2005/0184781 A1 | | 8/2005 | Nagasue | 327/175 |
| 2007/0279109 A1 | * | 12/2007 | Kirschenmann | 327/156 |
| 2008/0111597 A1 | * | 5/2008 | Cranford et al. | 327/156 |
| 2008/0111633 A1 | * | 5/2008 | Cranford et al. | 331/10 |
| 2008/0146186 A1 | * | 6/2008 | Rofougaran et al. | 455/333 |
| 2008/0212730 A1 | * | 9/2008 | Tang et al. | 375/376 |
| 2008/0258835 A1 | * | 10/2008 | Galloway et al. | 332/127 |

\* cited by examiner

*Primary Examiner* — Lincoln Donovan
*Assistant Examiner* — Adam Houston (57) ABSTRACT

A clock signal generator and conditioner in which dual integrated phase-locked loop (PLL) circuits use an off-chip frequency-pullable crystal resonator or voltage-controlled oscillator (VCO) module and an on-chip VCO with intra-PLL frequency doubling to provide a clock signal with reduced in-band phase noise and RMS jitter. As desired, synchronization between the input and output clocks can also be provided.

10 Claims, 6 Drawing Sheets

PROGRAMMABLE DUAL PHASE-LOCKED LOOP CLOCK SIGNAL GENERATOR AND CONDITIONER

CROSS-REFERENCE TO RELATED APPLICATIONS

This application is a Divisional of U.S. patent application Ser. No. 12/185,452 filed Aug. 4, 2008 which claims priority to U.S. Provisional Application No. 61/076,240, the disclosures of which are incorporated by reference herein in their entirety.

BACKGROUND

1. Field of the Invention

The present invention relates to circuits for generating clock signals, and in particular, to phase-locked loop (PLL) circuits for generating and conditioning clock signals.

2. Related Art

To generate low jitter clock signals from a noisy input clock, a conventional solution has been to use a narrow-band PLL with an external VCXO (voltage-controlled crystal oscillator) or an external VCSO (voltage-controlled surface-acoustic-wave (SAW) oscillator). This also generally results in low phase noise due to the use of a high-Q resonator, such as a crystal resonator for a VCXO, or a surface-acoustic-wave (SAW) resonator for a VCSO.

Figure 1:
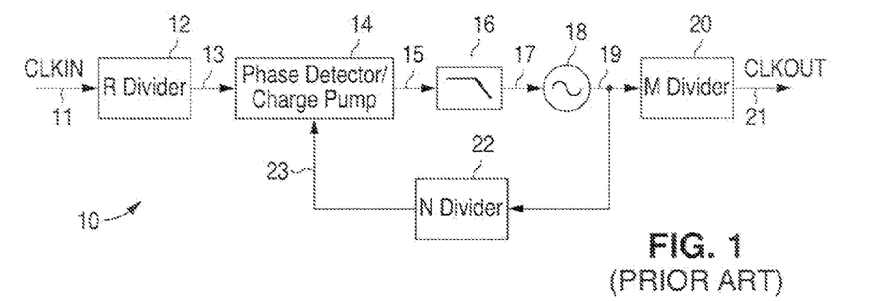
FIG. 1 is a functional block diagram of a conventional PLL.

Referring to FIG. 1, conventional PLL circuits are well known in the art, and are used in many applications. A typical PLL 10 receives its input clock signal 11, which is often divided down in frequency by a divisor R with a frequency divider 12. The frequency-divided input signal 13 is compared in phase with a feedback signal 23 by a phase detector and charge pump circuit 14. This produces an error signal 15 corresponding to the difference in phase between the two input signals 13, 23. This error signal 15 is filtered by a low pass filter 16 to produce a low frequency control signal 17 for a voltage-controlled oscillator (VCO) 18. The signal 19 generated by the VCO 18 is fed back and divided down in frequency by a feedback divisor N with a frequency divider 22 to produce the feedback signal 23. The VCO output signal 19 is also often divided down in frequency by an output divisor M with an output frequency divider 20 to produce the final output signal 21.

While such a circuit 10 is well understood and reliable for use in generating signals for many uses, many modern electronic systems, such as wireless base-stations, test and measurement instruments, medical equipments, etc, require low jitter, high frequency (e.g., approaching gigahertz frequencies) clock signals from a noisy input clock or from a common stable reference clock. Low cost multiple-gigahertz LC (inductive-capacitive) VCOs are available. However, the typically poor close-in phase noise of an LC VCO limits the output clock jitter performance when PLL loop bandwidth is made narrow to filter out the input clock noise. Since high frequency VCXOs or VCSOs in the gigahertz frequency range are difficult to manufacture and are often prohibitively expensive, the conventional PLL 10 is not a good choice for generating low jitter, high frequency clock signals from noisy input clocks for low cost electronic systems.

SUMMARY

In accordance with the presently claimed invention, a clock signal generator and conditioner is provided in which dual integrated phase-locked loop (PLL) circuits use an off-chip frequency-pullable crystal resonator or voltage-controlled oscillator (VCO) module and an on-chip VCO with intra-PLL frequency doubling to provide a clock signal with reduced in-band phase noise and RMS jitter. As desired, synchronization between the input and output clocks can also be provided.

In accordance with one embodiment of the presently claimed invention, integrated clock signal generator circuitry includes:

a first electrode to convey an off-chip control signal for off-chip voltage-controlled oscillator (VCO) circuitry;

a second electrode to convey from the off-chip VCO circuitry an off-chip VCO signal having a first frequency related to the off-chip control signal;

first phase detection circuitry coupled to the first and second electrodes and responsive to an input reference signal and the off-chip VCO signal by providing the off-chip control signal, wherein the off-chip VCO signal is synchronized with the input reference signal;

frequency alteration circuitry coupled to the second electrode and responsive to the off-chip VCO signal by providing an intermediate signal having a second frequency related to the first frequency; and phase lock loop (PLL) circuitry coupled to the frequency alteration circuitry and responsive to the intermediate signal by providing a PLL signal having a third frequency related to the second frequency, wherein the PLL signal is synchronized with the intermediate signal.

In accordance with another embodiment of the presently claimed invention, integrated clock signal generator circuitry includes:

a first electrode to convey an off-chip control signal for off-chip voltage-controlled oscillator (VCO) circuitry;

a second electrode to convey from the off-chip VCO circuitry an off-chip VCO signal having a first frequency related to the off-chip control signal;

first phase detection circuitry coupled to the first and second electrodes and responsive to an input reference signal and a phase lock loop (PLL) signal by providing the off-chip control signal;

frequency alteration circuitry coupled to the second electrode and responsive to the off-chip VCO signal by providing an intermediate signal having a second frequency related to the first frequency; and PLL circuitry coupled to the frequency alteration circuitry and responsive to the intermediate signal by providing a PLL signal having a third frequency related to the second frequency, wherein the PLL signal is synchronized with the input reference signal.

In accordance with another embodiment of the presently claimed invention, integrated clock signal generator circuitry includes:

first phase detector means for receiving an input reference signal and an off-chip VCO signal from off-chip voltage-controlled oscillator (VCO) circuitry and in response thereto providing an off-chip control signal for the off-chip VCO circuitry, wherein the off-chip VCO signal has a first frequency related to the off-chip control signal and is synchronized with the input reference signal;

frequency alteration means for receiving the off-chip VCO signal and in response thereto providing an intermediate signal having a second frequency related to the first frequency; and phase lock loop (PLL) means for receiving the intermediate signal and in response thereto providing a PLL signal having a third frequency related to the second frequency, wherein the PLL signal is synchronized with the intermediate signal.

In accordance with another embodiment of the presently claimed invention, integrated clock signal generator circuitry includes:

first phase detector means for receiving an input reference signal and a phase lock loop (PLL) signal and in response thereto providing an off-chip control signal for off-chip voltage-controlled oscillator (VCO) circuitry;

frequency alteration means for receiving an off-chip VCO signal from the off-chip VCO circuitry and in response thereto providing an intermediate signal, wherein the off-chip VCO signal has a first frequency related to the off-chip control signal and the intermediate signal has a second frequency related to the first frequency; and PLL means for receiving the intermediate signal and in response thereto providing the PLL signal, wherein the PLL signal has a third frequency related to the second frequency and is synchronized with the input reference signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 2:
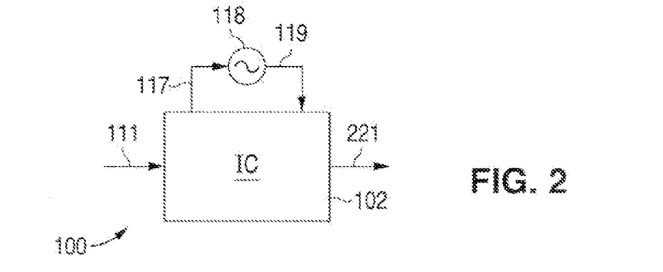
FIG. 2 is a functional block diagram of a PLL circuit in accordance with one embodiment of the presently claimed invention.

Referring to FIG. 2, PLL circuitry 100 in accordance with the presently claimed invention includes dual PLL circuits (discussed in more detail below) implemented in an integrated circuit 102, with the first VCO 118 being external to the integrated circuit 102 and receiving its filtered control signal 117 from and providing its output signal 119 to the PLL circuitry within the integrated circuit 102. In accordance with preferred embodiments of the presently claimed invention, such PLL circuitry 100 is for generating a high frequency, low jitter clock signal from an input clock signal, the integrated circuit 102 is programmable, and the external VCO 118 is a VCXO or VCSO with a "frequency-pullable" crystal resonator.

Figure 3:
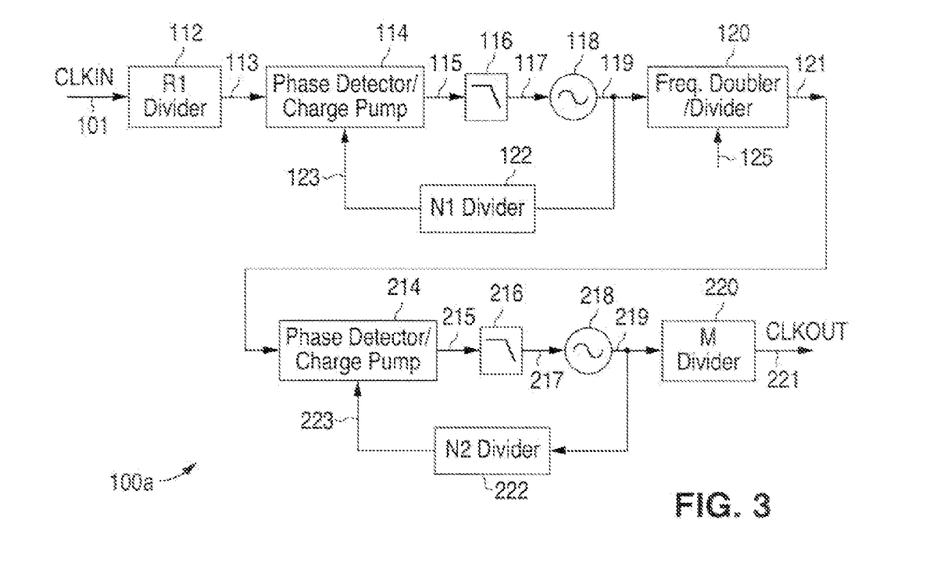
FIG. 3 is a functional block diagram of an exemplary embodiment of the circuit of FIG. 2.

Referring to FIG. 3, PLL circuitry 100a in accordance with one embodiment of the presently claimed invention includes dual PLL circuits operating substantially in a sequential arrangement. The input clock signal 101 is, if desired, divided by an input divisor R1 with a frequency divider 112. The frequency-divided signal 113 is compared in phase with a feedback signal 123 by a phase detector and charge pump circuit 114. This produces the error signal 115 corresponding to the difference in phase between the two input signals 113, 123. This error signal 115 is filtered by a low pass filter 116 to produce the low frequency control signal 117 for the first VCO 118, which is off-chip as discussed above. The VCO output signal 119 is divided down in frequency by a feedback divisor N1 with a feedback divider 122 to produce the feedback signal 123 for the first PLL. The VCO output signal 119 is also divided or doubled in frequency, as desired, by a frequency doubler and divider 120 in accordance with a control signal 125. The resulting output signal 121 serves as the input clock, or reference, signal for the second PLL circuit and is compared in phase with a second feedback signal 223 by another phase detector and charge pump circuit 214. The resulting signal 215, corresponding to the difference in phase between the two input signals 121, 223, is filtered by another low pass filter 216 to produce the low frequency control signal for another VCO 218, which is on-chip. The VCO output signal 219 is divided down in frequency by another feedback divisor N2 with another feedback divider 222 to produce the feedback signal 223. The VCO output signal 219 can also be divided down in frequency by an output divisor M with an output frequency divider 220 to produce the final output clock signal 221.

When using an off-chip low-noise VCO as the first VCO 118, which operates at lower frequency than the second VCO 218, simple, widely available and inexpensive low frequency (e.g., below 250 MHz) oscillators can be used. When using a VCXO with integrated active circuitry for the first VCO 118, an off-chip crystal resonator and tuning diodes, or varactors, can be used to allow "pulling" of the crystal-controlled frequency. Additionally, it is well known that PLL in-band phase noise is related to its phase detector operating frequency, i.e., a higher phase detector operating frequency allows lower PLL in-band phase noise, or lower clock jitter. Therefore, by including the frequency doubler 120 at the output of the first PLL for doubling the frequency of the first VCO signal 119 to be provided as the input signal 121 for the second PLL, reductions in in-band phase noise and RMS jitter of the output signal 221 of the second PLL can be achieved (frequency doubler discussed in more detail below). Alternatively, in accordance with the control signal 125, when frequency doubling is not required (e.g., when the frequency of the first VCO 118 is already sufficiently high for lowering the in-band phase noise, or the system frequency plan does not allow for frequency doubling), frequency division instead of doubling can be used to generate additional output signal frequencies, in conjunction with appropriate input R1 and output M frequency divisors.

As discussed above, the frequency range of the output signal 221 is often desired to be in the multiple gigahertz frequencies. Such high frequencies allow for the use of a resonant tank circuit as the second VCO 218 with inductive and capacitive components integrated within the integrated circuit 102 (FIG. 2). As is well known, such resonant tank circuit oscillators provide better noise performance than ring oscillators.

Figure 4:
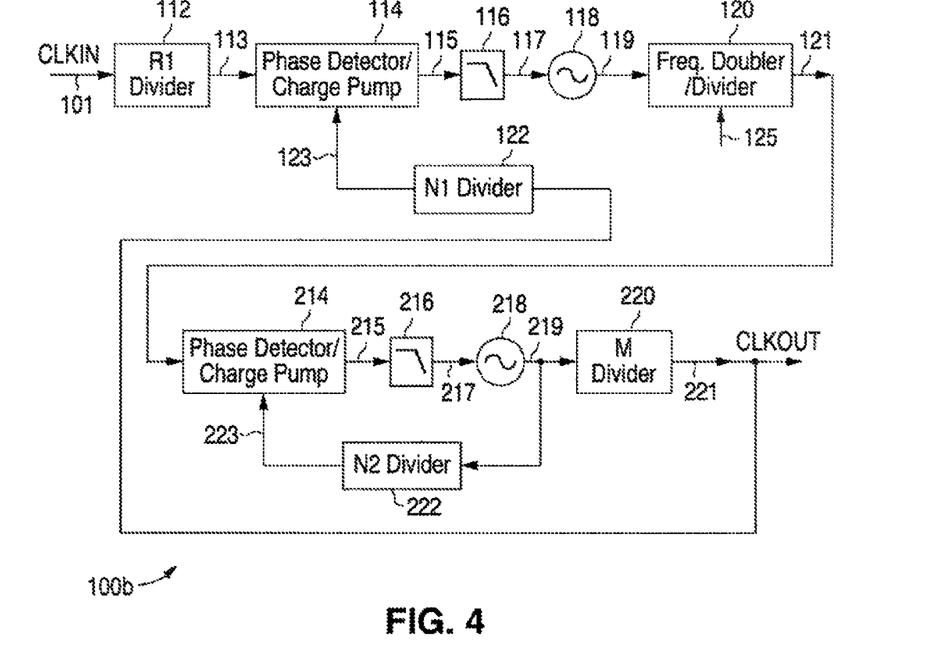
FIG. 4 is a functional block diagram of another exemplary embodiment of the circuit of FIG. 2.

Referring to FIG. 4, in accordance with an alternative embodiment 100b of the presently claimed invention, the dual PLL circuits include the elements of and operate as described above for the embodiment 100a of FIG. 3, with one exception which achieves synchronization between the input clock 101 and output clock 221. In this embodiment, 100b, the first PLL output signal 121 still serves as the reference signal for the second PLL circuit, but the first VCO signal 119 is not fed back and divided down in frequency by the first feedback divider 122 for a phase comparison with the first input signal 113. Instead, the second PLL output signal 221 is fed back. This allows the final output clock signal 221 to be made synchronous with the original input clock signal 101. (Alternatively, the second VCO signal 219 can be fed back and divided down in frequency by the first feedback divider 122 for a phase comparison with the first input signal 113.)

Figure 5:
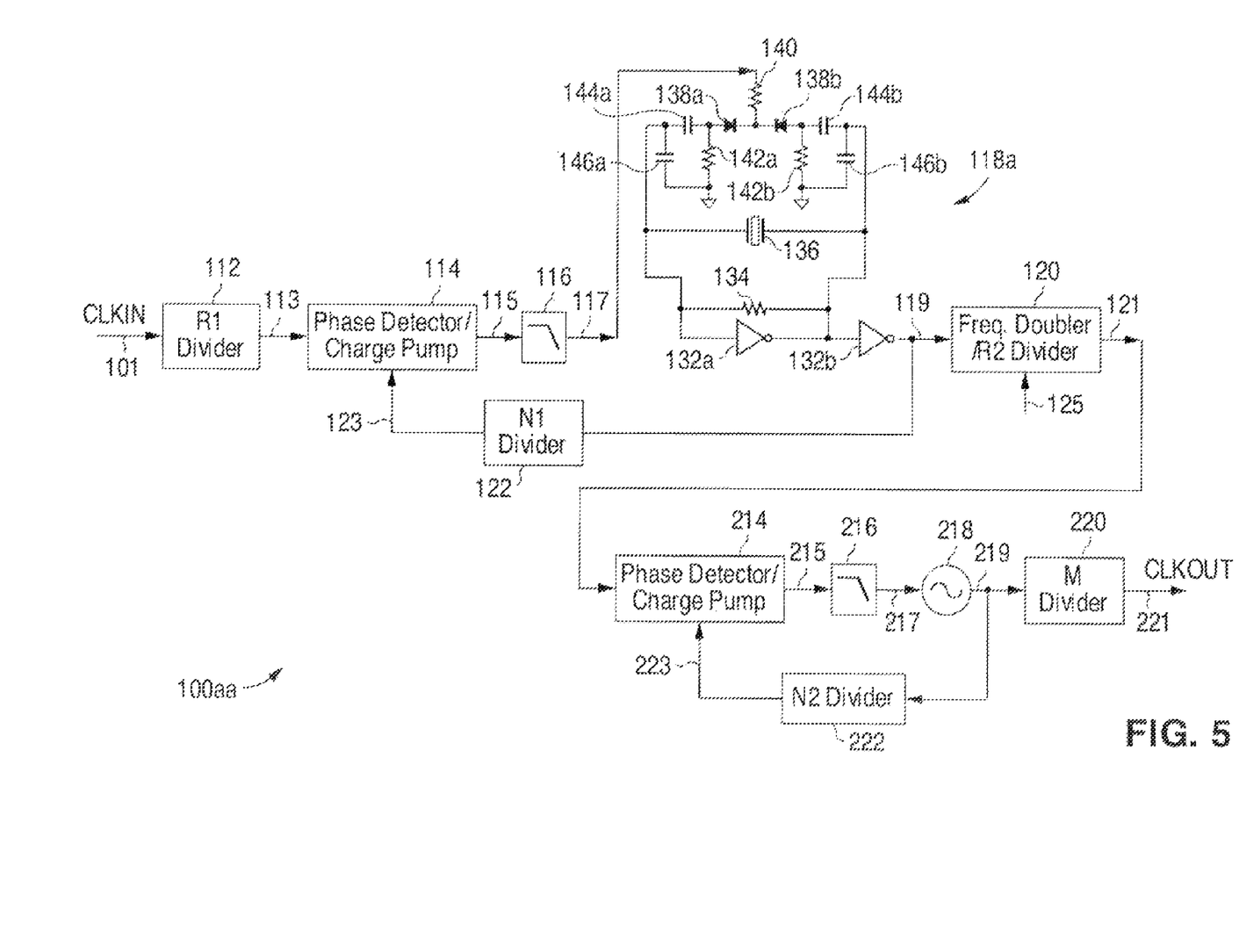
FIG. 5 is a functional block diagram of another exemplary embodiment of the circuit of FIG. 3.

Referring to FIG. 5, in accordance with one example embodiment 100aa of the circuit 100a of FIG. 3, much of the active circuitry associated with the VCO 118a can be integrated on-chip while the frequency-pullable crystal resonator and tuning circuitry are off-chip. The frequency can be "pulled" by tuning a pair of varactors. (This eliminates the requirement of an external VCXO or VCSO module and further reduces total system cost.) The VCO control signal 117, via an isolation resistance 140, controls the bias on tuning diodes 138a, 138b, which, together with trimming resistances 142a, 142b and capacitances 144a, 144b, 146a, 146b, "pull" the oscillation frequency of the crystal 136 higher or lower, depending upon the control signal 117. (As is well known in the art, as the control signal 117 causes the capacitances of the varactors 138a, 138b to change, the equivalent circuit model of the crystal 136 changes thereby changing its frequency of oscillation. The trimming resistances 142a, 142b and capacitances 144a, 144b, 146a, 146b can be used to establish and adjust the center frequency and tuning range.) The resulting signal appearing across the shunt resistance 134 is amplified by an inverting amplifier 132a and further buffered by another inverting amplifier 132b to produce the VCO output signal 119.

Depending upon the desired implementation or design constraints, some of these VCO elements may be incorporated within the integrated circuit 102 (FIG. 2). For example, the amplifiers 132a, 132b and load resistance 134 can be incorporated on-chip, with the crystal 136, tuning diodes 138a, 138b, trimming elements 142a, 142b, 144a, 144b, 146a, 146b and input resistance 140 being implemented off-chip.

Figure 6:
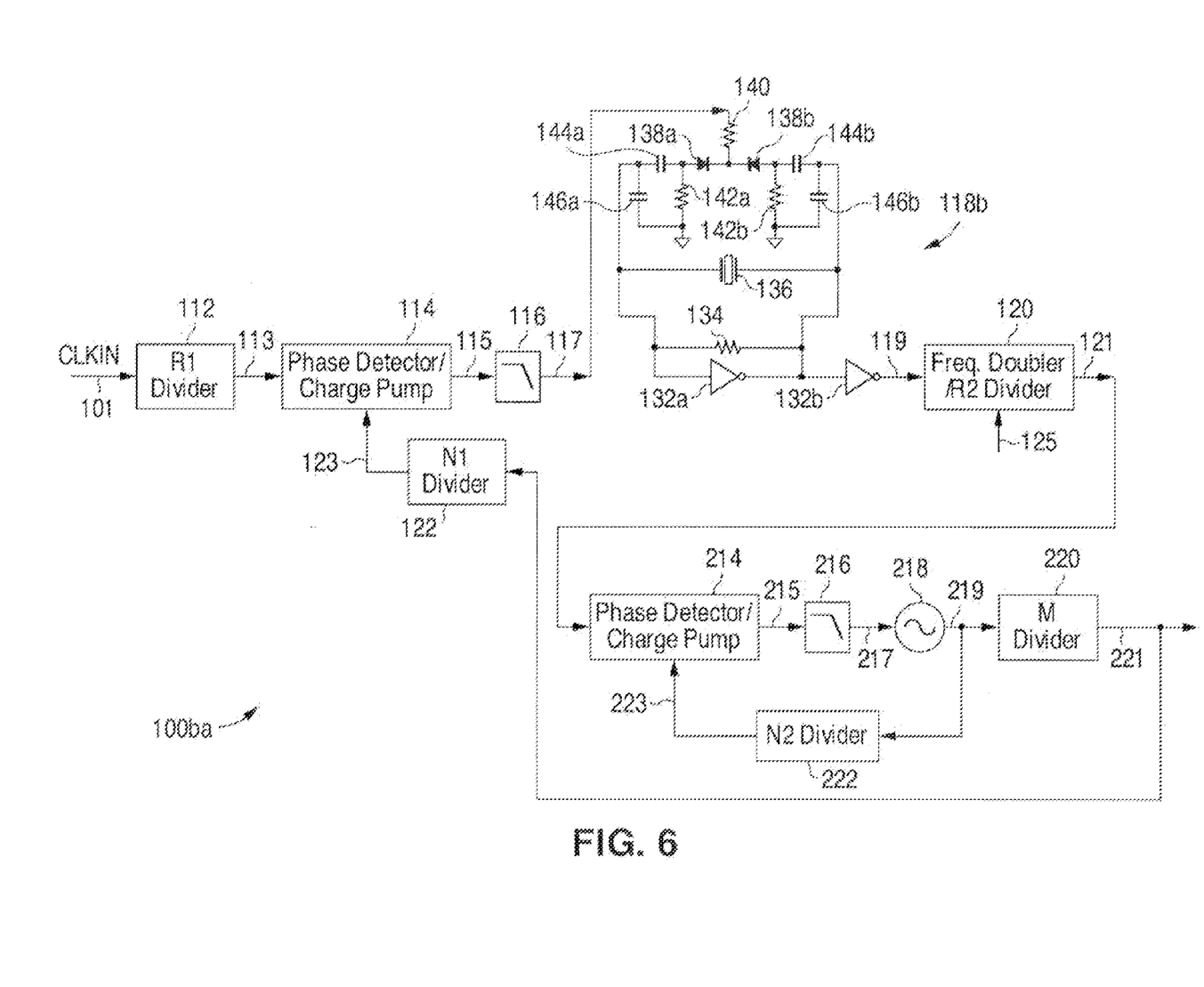
FIG. 6 is a functional block diagram of another exemplary embodiment of the circuit of FIG. 4.

Referring to FIG. 6, in accordance with an exemplary embodiment 100ba of the circuit 100b of FIG. 4, the VCO 118b can be implemented in the same manner as the embodiment 100aa of FIG. 5, as discussed above. In this embodiment 100ba, as in the embodiment of 100b of FIG. 4, the final output signal 221 is fed back to allow for synchronization of the output signal 221 to the input signal 101.

As shown in and discussed above for FIGS. 3-6, the first narrow band PLL (PLL1) accepts the input clock 101 and locks a low cost, low noise VCO 118, such as a VCXO or VCSO, e.g., with a center frequency less than 250 MHz, to provide a clean reference signal for the second PLL. Such a VCXO can be an integrated VCXO with an external frequency-pullable crystal resonator and tuning circuitry, or an off-the-shelf VCXO/VCSO module. The second wideband PLL (PLL2) locks a high frequency LC VCO up to multiple GHz. As desired, an intra-PLL frequency doubler 120 reduces in-band phase noise and RMS jitter of the output clock signal 221. The second PLL can be cascaded after the first PLL (FIGS. 3 and 5), or be embedded inside in the first loop (FIGS. 4 and 6). When the second PLL is embedded in the first PLL, synchronization of the input and output clocks can be implemented by feedback of the output clock 221 into the feedback divider 122 of the first PLL.

Figure 7:
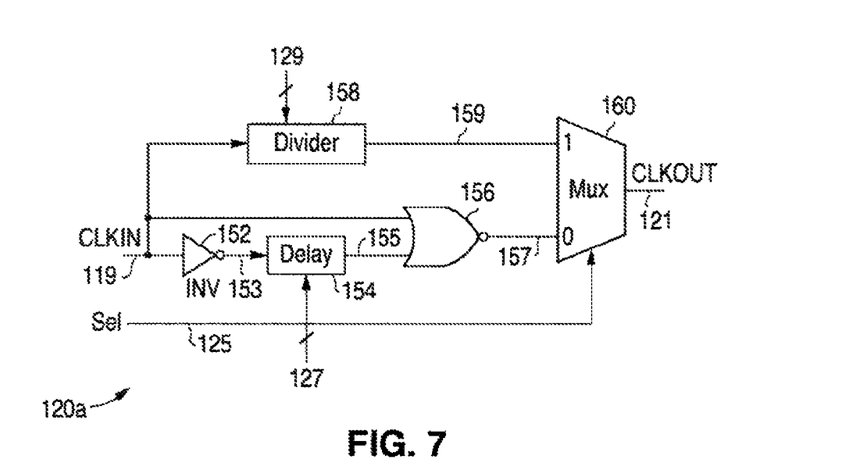
FIG. 7 is a functional block diagram of an exemplary embodiment of the frequency doubler and divider stage used in the circuits of FIGS. 2-6.

Referring to FIG. 7, an exemplary embodiment 120a of the frequency doubler and divider 120 (FIGS. 3-6) includes a logic inverter 152, a delay stage 154, a logic XNOR gate 156, a frequency divider 158 and a 2:1 multiplexor 160, interconnected substantially as shown. The first VCO output signal 119 serves as the input to the inverter 152 and frequency divider 158. The inverted clock signal 153 is delayed in the delay stage 154 by a predetermined time interval (which may also be programmable in accordance with one or more control signals 127). The resulting delayed and inverted clock signal 155 is logically XNORed with the original input signal 119, with the resultant frequency-doubled signal 157 serving as one of the inputs to the multiplexor 160. The VCO signal 119 is also divided down in frequency by the frequency divider 158 (for which the divisor can be programmable in accordance with one or more control signals 129). The frequency divided signal 159 serves as the other input to the multiplexor 160. One of these two input signals 157, 159 is selected as the output signal 121 in accordance with the multiplexor control signal 125. It will be readily appreciated that this frequency doubler and divider operation can be achieved with other implementations of combinational logic circuitry and can be implemented with various types of circuitry, e.g., CMOS (complementary metal oxide semiconductor) logic circuitry or differential logic such as current mode logic circuitry.

Figure 8:
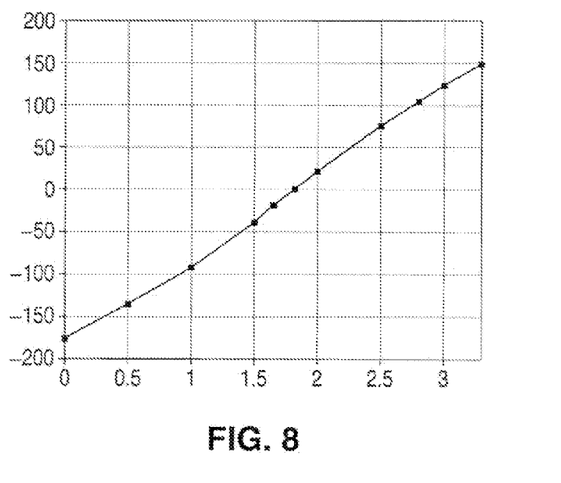
FIG. 8 is a graph illustrating an exemplary tuning range available with a PLL in accordance with the presently claimed invention.

Referring to FIG. 8, a prototype circuit implementing dual PLL circuits, as discussed above, was fabricated and tested using an external 12.288 MHz frequency-pullable crystal resonator and tuning diodes. The integrated VCXO of such prototype displayed a wide frequency tuning range in excess of +/−100 ppm.

Figure 9:
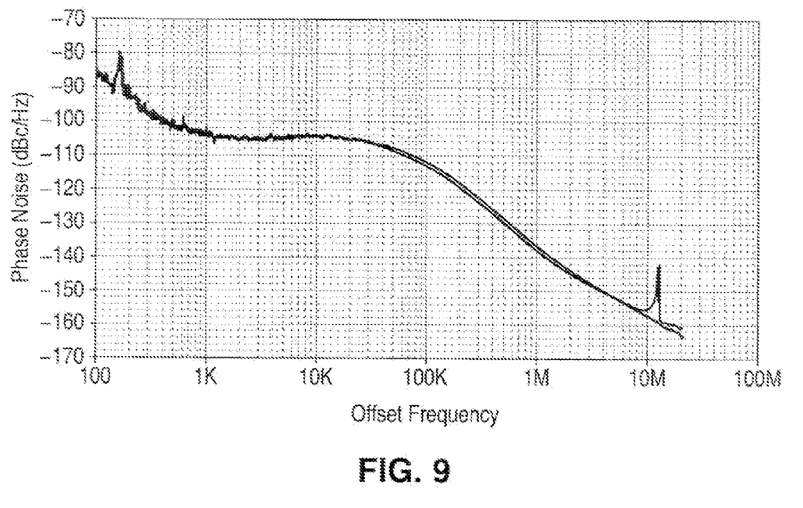
FIGS. 9 and 10 illustrate the improvement in phase noise available with the use of a PLL in accordance with the presently claimed invention.
Figure 10:
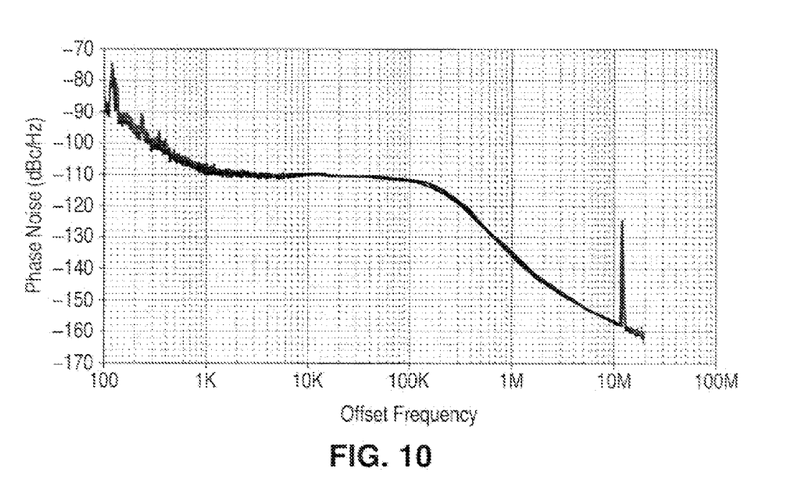

Referring to FIGS. 9 and 10, further testing of this prototype revealed improvements available when enabling the frequency doubler 120 at the output of the first PLL stage (FIGS. 3-6). As can be seen in FIG. 9, with frequency doubling disabled, the in-band phase noise within the offset frequency range between 1 KHz and 10 KHz is approximately −105 dBc/Hz. As seen in FIG. 10, with frequency doubling enabled, such in-band phase noise is improved to approximately −110 dBc/Hz.

Figure 11:
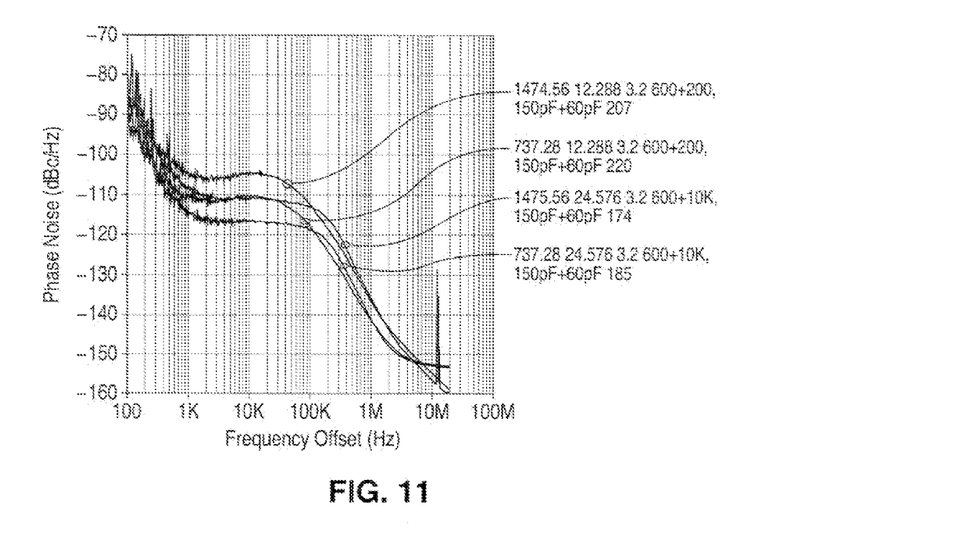
FIG. 11 illustrates improvements in output clock jitter available through the use of a PLL in accordance with the presently claimed invention.

Referring to FIG. 11, further testing of this prototype for RMS jitter (integrated from 12 KHz to 20 MHz) for an output clock signal of 737.28 megahertz is reduced from 220 fs to 185 fs when frequency doubling is enabled.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including integrated clock signal generator circuitry, comprising:
    a first electrode to convey an off-chip control signal for off-chip voltage-controlled oscillator (VCO) circuitry;
    a second electrode to convey from said off-chip VCO circuitry an off-chip VCO signal having a first frequency related to said off-chip control signal;
    first phase detection circuitry coupled to said first and second electrodes and responsive to an input reference signal and a phase lock loop (PLL) signal by providing said off-chip control signal;
    frequency alteration circuitry coupled to said second electrode and responsive to said off-chip VCO signal by providing an intermediate signal having a second frequency related to said first frequency; and
    PLL circuitry coupled to said frequency alteration circuitry and responsive to said intermediate signal by providing said PLL signal, wherein said PLL signal has a third frequency related to said second frequency and is synchronized with said input reference signal.

2. The apparatus of claim 1, wherein said first phase detection circuitry comprises:
    phase-frequency detection circuitry responsive to said input reference signal and a feedback signal by providing said off-chip control signal; and
    frequency division circuitry responsive to said PLL signal by providing said feedback signal.

3. The apparatus of claim 1, wherein:
    said frequency alteration circuitry comprises controllable circuitry responsive to said off-chip VCO signal and one or more control signals by providing said intermediate signal; and
    said second frequency is selectively related to said first frequency by one of a divisor and a multiplicand.

4. The apparatus of claim 1, wherein said frequency alteration circuitry comprises:
    frequency division circuitry responsive to at least said off-chip VCO signal by providing a frequency-divided signal having a fourth frequency related to said third frequency by a divisor;
    signal delay circuitry responsive to said off-chip VCO signal by providing a delayed signal having said third frequency;
    signal comparison circuitry coupled to said signal delay circuitry and responsive to said off-chip VCO signal and delayed signal by providing a resultant signal having a fifth frequency related to said third frequency by a multiplicand; and
    signal selection circuitry coupled to said frequency division circuitry and said signal comparison circuitry, and responsive to one or more control signals by providing one of said delayed signal and resultant signal as said intermediate signal.

5. The apparatus of claim 1, wherein said PLL circuitry comprises:
    second phase detection circuitry responsive to said intermediate signal and an on-chip VCO signal by providing an on-chip control signal; and
    on-chip VCO circuitry coupled to said second phase detection circuitry and responsive to said on-chip control signal by providing said on-chip VCO signal.

6. The apparatus of claim 5, wherein said PLL circuitry further comprises frequency division circuitry responsive to said on-chip VCO signal by providing said PLL signal.

7. The apparatus of claim 5, wherein said second phase detection circuitry comprises:
    phase-frequency detection circuitry responsive to said intermediate signal and a feedback signal by providing said on-chip control signal; and
    frequency division circuitry responsive to said on-chip VCO signal by providing said feedback signal.

8. The apparatus of claim 5, wherein said on-chip VCO circuitry comprises a resonant tank circuit.

9. The apparatus of claim 8, wherein said resonant tank circuit comprises integrated inductive circuitry and integrated capacitive circuitry.

10. An apparatus including integrated clock signal generator circuitry, comprising:
    first phase detector means for receiving an input reference signal and a phase lock loop (PLL) signal and in response thereto providing an off-chip control signal for off-chip voltage-controlled oscillator (VCO) circuitry;
    frequency alteration means for receiving an off-chip VCO signal from said off-chip VCO circuitry and in response thereto providing an intermediate signal, wherein said off-chip VCO signal has a first frequency related to said off-chip control signal and said intermediate signal has a second frequency related to said first frequency; and
    PLL means for receiving said intermediate signal and in response thereto providing said PLL signal, wherein said PLL signal has a third frequency related to said second frequency and is synchronized with said input reference signal.

* * * * *